United States Patent
Berke et al.

(10) Patent No.: US 10,257,931 B2
(45) Date of Patent: Apr. 9, 2019

(54) SYSTEMS AND METHODS FOR PROVIDING GROOVED VIAS IN HIGH-SPEED PRINTED CIRCUIT BOARDS

(71) Applicant: Dell Products, L.P., Round Rock, TX (US)

(72) Inventors: Stuart Allen Berke, Austin, TX (US); Bhyrav M. Mutnury, Round Rock, TX (US); Sandor Farkas, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 171 days.

(21) Appl. No.: 15/019,369

(22) Filed: Feb. 9, 2016

(65) Prior Publication Data
US 2017/0231091 A1   Aug. 10, 2017

(51) Int. Cl.
H05K 1/11    (2006.01)
H05K 3/00    (2006.01)
H05K 1/02    (2006.01)
H05K 3/42    (2006.01)

(52) U.S. Cl.
CPC ........... *H05K 1/115* (2013.01); *H05K 1/0298* (2013.01); *H05K 3/0047* (2013.01); *H05K 3/0055* (2013.01); *H05K 3/429* (2013.01)

(58) Field of Classification Search
CPC ...... H05K 1/113; H05K 1/023; H05K 1/0222; H05K 1/0216
USPC ............................ 174/252–266; 361/760–777
See application file for complete search history.

(56) References Cited

U.S. PATENT DOCUMENTS

| 5,656,798 | A  | * | 8/1997 | Kubo | H01L 21/486 174/263 |
| 6,388,208 | B1 | * | 5/2002 | Kiani | H05K 1/0222 174/260 |
| 6,593,535 | B2 | * | 7/2003 | Gailus | H05K 3/308 174/262 |
| 6,711,814 | B2 | * | 3/2004 | Barr | H05K 1/115 174/262 |
| 6,747,217 | B1 | * | 6/2004 | Jochym | H01R 12/58 174/265 |
| 7,501,586 | B2 | * | 3/2009 | Wig | H05K 1/0216 174/262 |
| 9,781,844 | B2 | * | 10/2017 | Iketani | H05K 3/429 |
| 2004/0118605 | A1 | * | 6/2004 | van der Laan | H05K 3/429 174/262 |
| 2004/0136169 | A1 | * | 7/2004 | Morimoto | H05K 1/023 361/780 |

(Continued)

*Primary Examiner* — Tuan T Dinh
(74) *Attorney, Agent, or Firm* — Fogarty LLP

(57) ABSTRACT

Systems and methods for grooved vias are described. For example, a method may include: drilling a via hole in a Printed Circuit Board (PCB), where the PCB comprises a first layer having a first trace and a second layer having a second trace, the via hole includes a first portion between the first layer and the second layer and a second portion between the second layer and a bottom surface of the PCB, and the via hole is configured to couple the first trace to the second trace through the first portion; after drilling the via hole, creating a rough internal surface in at least the second portion of the via hole that is configured to reduce a resonance of a signal transmitted from the first trace to the second trace; and forming a via by filling the first and second portions of the via hole with conductive material.

12 Claims, 7 Drawing Sheets

(56) References Cited

U.S. PATENT DOCUMENTS

| | | | |
|---|---|---|---|
| 2005/0128672 A1* | 6/2005 | Tourne | H05K 3/0047 |
| | | | 361/119 |
| 2007/0091581 A1* | 4/2007 | Gisin | H05K 1/023 |
| | | | 361/782 |
| 2009/0045889 A1* | 2/2009 | Goergen | H05K 1/0216 |
| | | | 333/175 |
| 2012/0292088 A1* | 11/2012 | Lee | H05K 1/113 |
| | | | 174/260 |
| 2014/0238733 A1 | 8/2014 | Mutnury et al. | |
| 2015/0180104 A1* | 6/2015 | Ao | H01P 1/2039 |
| | | | 333/204 |
| 2015/0211837 A1 | 7/2015 | Mutnury et al. | |
| 2015/0216046 A1 | 7/2015 | Berke et al. | |

* cited by examiner

SYSTEMS AND METHODS FOR PROVIDING GROOVED VIAS IN HIGH-SPEED PRINTED CIRCUIT BOARDS

FIELD

This disclosure relates generally to Information Handling Systems (IHSs), and more specifically, to systems and methods for grooved vias for high-speed IHSs.

BACKGROUND

As the value and use of information continues to increase, individuals and businesses seek additional ways to process and store information. One option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

An IHS may include one or more printed circuit boards (PCBs) operable to mechanically support and electrically couple electronic components making up the IHS. For example, PCBs may be used as part of motherboards, memories, storage devices, storage device controllers, peripherals, peripheral cards, network interface cards, and/or other electronic components.

A PCB may comprise a plurality of conductive layers separated and supported by layers of insulating material laminated together, with conductive traces disposed on and/or in any of such conductive layers. Connectivity between traces disposed on and/or in various layers of a PCB may be provided by conductive vias.

SUMMARY

Embodiments of systems and methods for grooved vias for high-speed Information Handling Systems (IHSs) are described herein. In an illustrative, non-limiting embodiment, a method may include: drilling a via hole in a Printed Circuit Board (PCB), where the PCB comprises a first layer having a first trace and a second layer having a second trace, where the via hole includes a first portion between the first layer and the second layer and a second portion between the second layer and a bottom surface of the PCB, and where the via hole is configured to couple the first trace to the second trace through the first portion; after drilling the via hole, creating a rough internal surface in at least the second portion of the via hole that is configured to reduce a resonance of a signal transmitted from the first trace to the second trace; and forming a via by filling the first and second portions of the via hole with conductive material.

The method may further include creating the rough internal surface in the first portion of the via hole. The via hole may include a third portion between the first layer and a top surface of the PCB, the method further comprising creating the rough internal surface in the third portion of the via hole. The method may further include creating the rough internal surface in the second and third portions of the via hole without creating the rough internal surface in the first portion of the via hole.

In some cases, drilling the via hole may include using a first drill bit, and creating the rough internal surface may include using a second drill bit different from the first drill bit. A length of the second portion may be approximately a quarter of a wavelength of the signal transmitted through the first portion, and a diameter of the via may be smaller than approximately 10 mils. The rough internal surface may include a thread having a pitch of approximately 0.5 mils. The method may further comprise backdrilling the via to remove a portion of the conductive material in the second portion of the via hole.

In another illustrative, non-limiting embodiment, an IHS may include: a Printed Circuit Board (PCB) having a plurality of layers; and an Integrated Circuit (IC) coupled to the PCB, the PCB comprising: a first trace formed in a first layer of the PCB; a second trace formed in a second layer of the PCB; and a via configured to couple the first trace to the second trace, the via comprising: a first portion between the first trace and the second trace; and a second portion between the second trace and a bottom surface of the PCB, where the second portion has a length that causes a signal transmitted through the first portion to resonate within the second portion, and where at least the second portion has a grooved internal surface configured to reduce the resonance.

The PCB may be a motherboard having a thickness of approximately 60 to 300 mils. The IC may be a Central Processing Unit (CPU). The length of the second portion may be approximately a quarter of a wavelength of the signal transmitted through the first portion. The grooved internal surface may include a threaded or jagged surface. The first portion may have a grooved internal surface configured to reduce the resonance. The length of the second portion may be approximately 10 mils, a pitch of the threaded or jagged surface may be approximately 0.5 mils, and the signal may have a speed exceeding approximately 5 Gbps.

In yet another illustrative, non-limiting embodiment, a PCB may include: a first layer having a first trace; a second layer having a second trace; and a via configured to couple the first trace to the second trace, the via comprising: a first portion between the first trace and the second trace; and a second portion between the second trace and a bottom surface of the PCB, where the second portion has a length that causes a signal transmitted through the first portion to resonate within the second portion, and where the first and second portions have a roughened surface configured to reduce the resonance.

The length of the second portion may be approximately a quarter of a wavelength of the signal transmitted through the first portion. The via may have a diameter smaller than 10 mils. The roughened surface may include a thread. A pitch of the thread may be approximately 0.5 mils.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

Systems and methods for grooved vias are described herein. In various embodiments, these grooved vias may be used in a high-speed Information Handling System (IHS). For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components.

In many embodiments, an IHS may include one or more printed circuit boards (PCBs) operable to mechanically support and electrically connect electronic components making up the IHS (e.g., packaged integrated circuits). PCBs may be used as part of motherboards, memories, storage devices, storage device controllers, peripherals, peripheral cards, network interface cards, and/or other electronic components. As used herein, the terms "circuit board," "printed circuit board" or "PCB" includes PCBs, printed wiring boards (PWBs), etched wiring boards, and/or any other board or similar physical structure operable to mechanically support and electrically couple electronic components.

Figure 1:
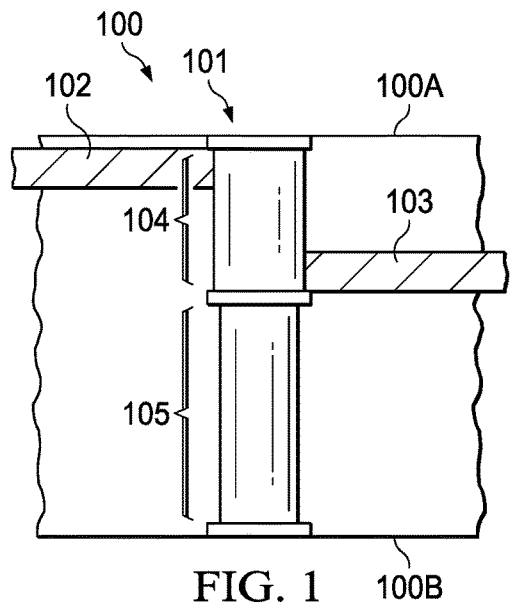
FIGS. 1-3 are diagrams of examples of Printed Circuit Board (PCB) vias according to some embodiments.

FIG. 1 depicts an elevation view of PCB 100 having via 101. As shown in FIG. 1, PCB 100 is made of a generally non-conductive or insulating substrate that comprises various layers. PCB 100 includes top surface 100A and bottom surface 100B, and its signal layers include, in this example, first conductive trace 102 and second conductive trace 103. As components (e.g., a Central Processing Unit or CPU, etc.) are coupled to or mounted on PCB 100, signal layers allow signals to be communicated between those components, some of which may include high-speed signals.

Typically, during manufacturing of PCB 100, via 101 is formed to approximately the thickness of PCB 100 (that is, between surfaces 100A and 100B), thus permitting electrical conductivity between traces 102 and 103 on the various layers of PCB 100 through "used portion" 104. As a result, portion 105 of via 101 may be "unused" in the sense that such portion is present—but not needed to conduct a signal.

Traces 102 and 103 may comprise a substantially electrically conductive material and may be formed on a surface of PCB 100, or in a layer of PCB 100 not visible from the surface thereof. Via 101 may comprise a substantially electrically conductive material and may be formed such that via 101 may electrically couple together traces 102 and 103 on different layers of PCB 100, thus allowing signals to propagate between layers of PCB 100. In some embodiments, via 101 may be substantially cylindrical in shape.

Traces 102 and 103, via 101, and termination pads (shown in FIG. 4) may comprise silver, copper, aluminum, lead, nickel, other metals, metal alloys, and/or any other conductive material that may readily conduct electrical current.

As may be seen from FIG. 1, via 101 may have portion 104 used to create an electrically conductive pathway between traces 102 and 103 on different layers of PCB 100, and unused portion or "stub" 105 which is not part of an electrically conductive path between traces 102 and 103. Via stub 105 may act as an antenna, and thus may resonate at frequencies (and harmonics thereof) for which the length of stub 105 is equal to one-quarter of the wavelength of such frequencies. As transmission frequencies used in PCB 100 increase, signals operating at such frequencies may be affected by such resonances.

Particularly, the portion of a via between a trace layer having a connection to a metal trace and a trace layer at an end of a via is referred to herein as a "via stub." An end of a via stub not connected to a metal trace is referred to as a "stub end" of the via. A signal reaching a stub end of a via stub can be reflected and travel back up the via. This reflected signal can combine with a non-reflected signal traveling down the via, and the resulting combined signal can leave the via through a metal trace.

Characteristics of the combined signal exiting via 101 at trace 103 can depend, at least in part, on the frequencies present in the signal, on the physical characteristics of the via stub, and on the electrical characteristics of the via. In an embodiment, a strength of a signal passing through a via having a via stub can be attenuated based on the length of the via stub, the conductivity of the plating of the via stub and a frequency of the signal.

A via stub having a length equal to a quarter wavelength of a frequency in a signal can cause the signal to travel a half of a wavelength from the metal trace at which the signal exits the via to the stub end and back to the metal trace for a total distance of a half wavelength. This half wavelength travel can have the effect of shifting the phase of the signal by 180 degrees. This effect can be referred to as a "resonance" of the via stub. The 180 degree phase-shifted reflected signal has a maximum value at a time when the signal has a minimum value, and has a minimum value at a time when the signal has a maximum value.

When the conductivity of the via is high, the reflected signal has approximately the same strength at the metal trace as the un-reflected signal. Thus, frequency components of the combined signal can be highly attenuated at a first frequency whose wavelength is approximately four times the length of the via stub. Signal frequency components that are odd multiples of the first frequency can also be highly attenuated, resulting in decreased signal integrity.

In that regard, a via can be modeled as a transmission line at high frequencies, for example frequencies higher than 1 GHz. The relationship between a quality factor (Q) of a via, the resistance of a via, and a frequency of a signal communicated through the via is given by the relationships in equations 1-3 below:

$$QL_{via} \propto \frac{\omega L_{via}}{R_{via}} \quad \text{(Eq. 1)}$$

$$QC_{via} \propto \frac{1}{\omega C_{via} R_{via}} \quad \text{(Eq. 2)}$$

$$Q_{via} \propto \frac{1}{\frac{1}{QL_{via}} + \frac{1}{QC_{via}}} \quad \text{(Eq. 3)}$$

Where $Q_{via}$ represents a quality factor of a via, $QL_{via}$ represents a quality factor for an inductance of the via, $QC_{via}$ represents a quality factor for a capacitance of the via, $L_{via}$ represents and inductance of the via, $C_{via}$ represents a capacitance of the via, $R_{via}$ represents a resistance of the via, and $\omega$ represents a frequency of a signal communicated through the via.

As the conductivity of the material used to fill or plate a via decreases, the resistance of the via increases. According to the relationships shown in equations 1-3, an increased resistance of the via decreases a quality factor of the via. A reduced quality factor represents a dampening of the resonance of the via stub. Dampening the resonance of the via reduces the variation in attenuation of a signal as a function of frequency.

Although conventional approaches exist to help mitigate the effect of via stub resonances, such approaches have disadvantages. For example, backdrilling or counter boring may be used in which a mechanical drill is used to remove a part of via stub 105. However, such process may significantly increase the cost of circuit board manufacture. In addition, due to mechanical tolerances of a drill used to backdrill or counter bore, a small portion of via stub 105 may still remain, and thus some resonance may still occur. (Although certain techniques described herein may also involve using a second drill bit to make a grooved via, it is a less expensive process than backdrilling because, in contrast with backdrilling, here the depth of a grooved via does not generally need to be controlled as accurately.)

As the frequencies increase, unused portions of PCB via act like transmission lines and start resonating at quarter wavelength resulting in reflections and impact channel insertion loss. With tighter encoding schemes such as 8b10b on interfaces such as 10 GbE and FC-8 and FC-16, the frequency spectrum of these signals is moving to higher and higher frequencies, making them more sensitive to via resonances. Next generation, high-speed I/O signaling speeds will reach or exceed 32 Gbps to 56 Gbps, making via stub resonance a challenge.

A reason via stub has a huge impact on signal integrity is because the reflected signal from the via stub is delayed and added to the original signal, acting like a comb filter. Once the signal is distorted it is practically impossible to undo this effect at the receiver, leading to increased bit errors.

Compounding the problem, PCB thicknesses and thus via stub lengths are growing as systems include more functionality and higher pin count devices. On enterprise servers for instance, typical layer counts have grown from 6-8 layers a few years ago to 8-12 layers today on mainstream platforms, and from 8-12 to 16-24 layers on dense computing platforms. CPU and other critical component roadmaps show rapidly growing pin count and ball densities and layers necessary for break out, implying PCB layer counts and thicknesses will continue to rise.

Moreover, all high speed connectors that mate to midplane and blades need a minimum of 50 mils of connector pin length for good mechanical mating. This requirement renders certain routing layers "un-routable" depending on the stack-up as we violate the via stub requirement of 9 mils and below.

To address the aforementioned problems, in various embodiments discussed herein, via 101 may include a grooved internal surface, discussed in more detail below, that is configured to reduce a resonance of a signal transmitted from first trace 102 to second trace 103. In some cases, the entirety of via 101 may have grooved internal surfaces; that is, both portions 104 and 105. In other cases, only stub portion 105 may be grooved while used portion 104 has smooth internal surfaces.

Figure 2:
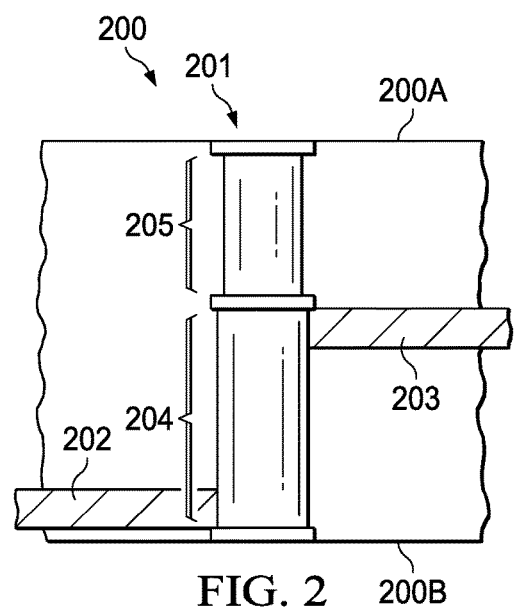

In another example, FIG. 2 shows a situation where first trace 202 is near bottom surface 200B of PCB 200, and second trace 203 is below top surface 200A. Via 201 includes used portion 204 and unused portion 205. Again, in some cases, both portions 204 and 205 of via 201 may have grooved internal surfaces, and in other cases only stub portion 205 may be grooved while used portion 204 has smooth internal surfaces.

Figure 3:
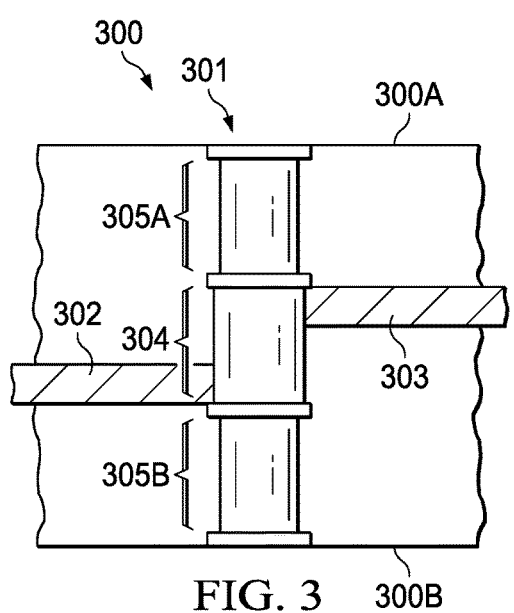

In yet another example, FIG. 3 shows another scenario where first trace 302 is below top surface 300A of PCB 300 and second trace 303 is above bottom surface 300B of PCB 300. Therefore via 301 has three portions: used portion 304, first unused portion 305A, and second unused portion 305B. In some cases, all portions 304, 305A, and 305B of via 301 may have grooved internal surfaces or walls, and in other cases only stub portions 305A and 305B may be grooved while used portion 304 has smooth internal surfaces or walls.

Figure 4:
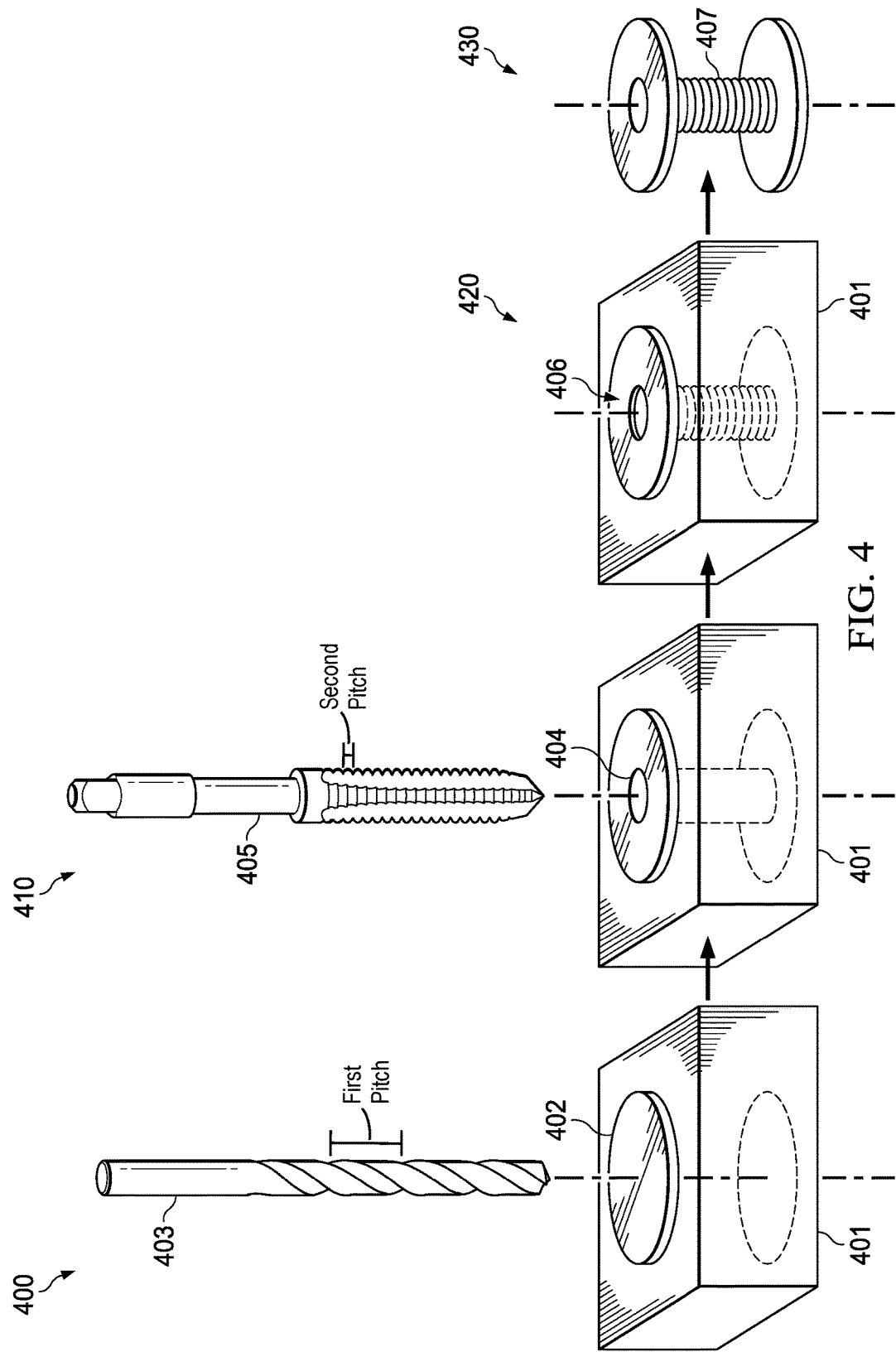
FIG. 4 is a diagram illustrating example operations used in the manufacturing of a grooved via according to some embodiments.

FIG. 4 is a diagram illustrating examples of operations used in the manufacturing of a grooved via according to some embodiments. Operation 400 shows PCB 401 with termination pad 402 formed thereon. Fine drill bit 403 is used to create smooth via hole 404 (with a smooth internal surface or wall) which, in this case, goes through the entire thickness of PCB 401. The result of operation 400 is PCB 401 with smooth via hole 404 ending on termination pad 404. During subsequent operation 410, a different, coarse drill bit 405 is used to create a threaded, roughened, or jagged internal surface within the via hole. The result of operation 410 is grooved via 406. In operation 420, grooved via 406 is then filled or plated with conductive material to result in structure 430 having internal grooved or threaded surface or wall 407.

As such, in various embodiments, first drill bit 403 may be configured to create a via hole having smooth walls, and second drill bit 405 may turn that smooth surface into a roughened surface designed to reduce a high-speed signal's resonance within the via.

Although drill bit 403 is used the foregoing example, it should be noted that in other implementations via holes may be obtained with other processes, such as by use of laser drilling. Similarly, the roughening of internal surface 406 prior to plating may be achieved using other methods, such as chemical treatment.

In some cases, via hole 404 may have a diameter of approximately (i.e., ±1%, ±5%, ±10%, or ±25%) 8 to 12 mils, or it may be smaller than approximately (i.e., ±1%, ±5%, ±10%, or ±25%) 10 mils, and second drill bit 405 may create threaded surface 407 having a pitch of approximately (i.e., ±1%, ±5%, ±10%, or ±25%) 0.5 mils. More generally, however, the pitch of the thread created by second drill bit 405 may be designed to maximize interference of a signal having a given frequency or speed, as described in connection with FIG. 5.

Figure 5:
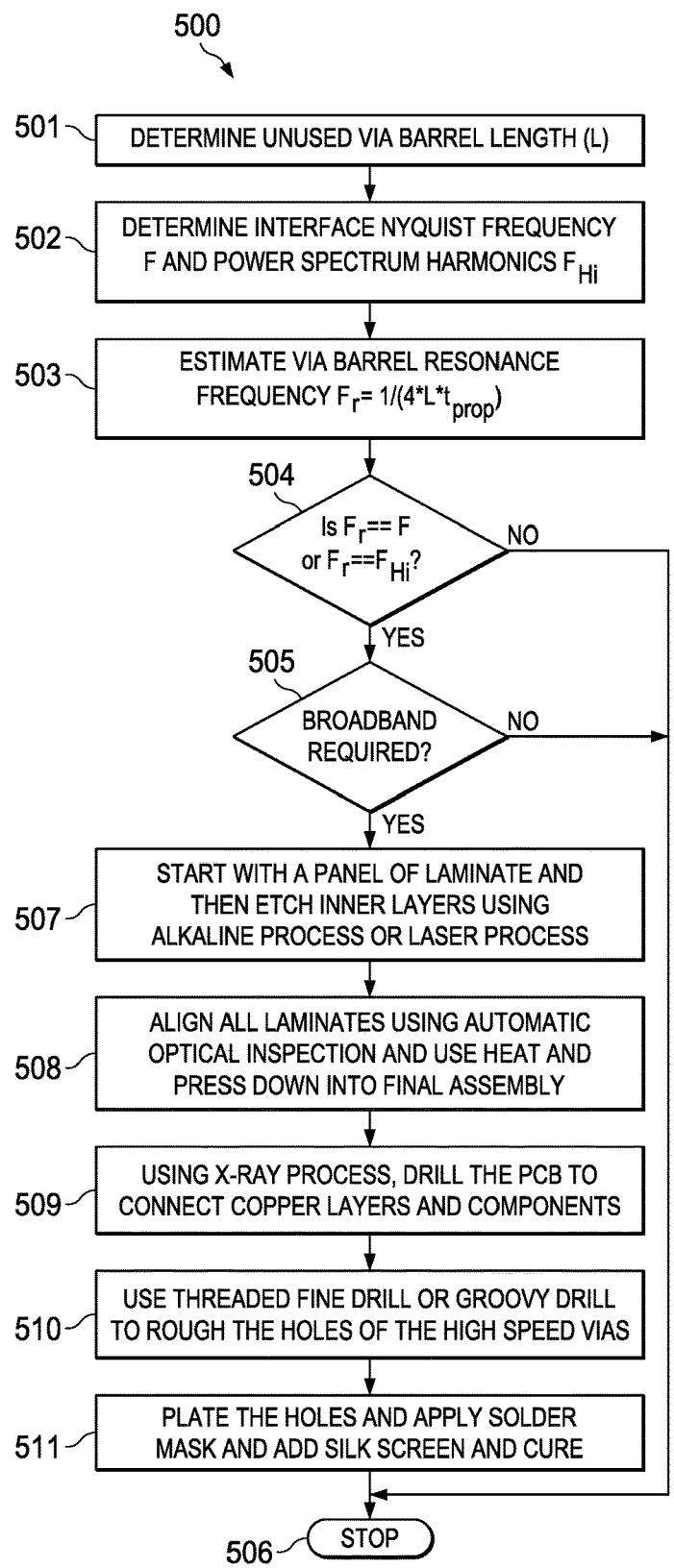
FIG. 5 is a flowchart of an example of a method for creating grooved vias according to some embodiments.

FIG. 5 is a flowchart of an example of method 500 for creating grooved vias according to some embodiments. At block 501, method 500 includes determining an unused via barrel length (L). At block 502, method 500 includes determining an interface's Nyquist frequency F and power spectrum harmonics $F_{Hi}$. At block 503, method 500 estimates the via barrel resonance frequency $F_r=1/(4*L*t_{prop})$. If the resonance frequency is different from the Nyquist frequency, or if the resonance frequency is different from the harmonics, method 500 ends at block 506.

If the resonance frequency matches the Nyquist frequency, or if the resonance frequency matches from the frequencies of the power harmonics, then the via is identified as candidate for having rough internal walls. Accordingly, if block 505 determines that broadband signals will be transmitted using the via, then blocks 507-511 may be performed to create grooved vias in a PCB.

To create grooved vias, method 500 starts at block 507 with a panel of laminate and then etching inner layers using an alkaline or laser process. At block 508, method 500 includes aligning all laminates using automatic optical inspection and using heat and pressing down into the final assembly to create a PCB. Block 509 drills the PCB to connect copper layers and components.

At block 510, method 500 uses a threaded fine drill (operation 400) and/or groovy drill (operation 410) to rough the via holes of a subset of all vias designed for high-speed communications. In some cases, a PCB may have thousands of vias, and only 10% or fewer of those vias may be high-speed vias with rough internal walls to attenuate resonances. As such, only those high-speed vias may be subject to operation 410. At block 511, method 500 includes plating the via holes, applying solder mask, and adding silk screen; thus resulting in the final PCB.

Figure 6:
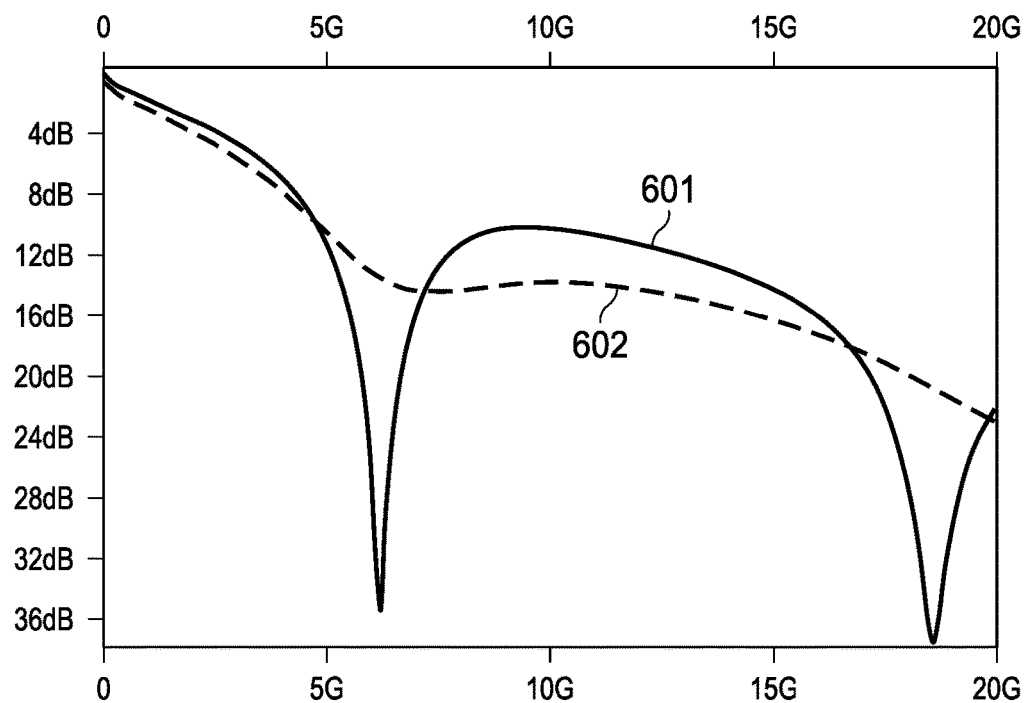
FIG. 6 is a graph of illustrating a resonance dampening effect of the systems and methods described herein according to some embodiments.

FIG. 6 is a graph of illustrating a resonance dampening effect according to some embodiments. Specifically curve 601 shows transmission of a 6 GHz signal through a smooth surface via, and curve 602 shows transmission of that same signal through a grooved via. It can be seen from graph 600 that the resonance occurring at 6 GHz without the systems and methods described herein (curve 601) is dampened severely in curve 602 to a degree that it has minimal to no impact on high-speed channels. The used portion (e.g., portion 104) of the via introduces a small amount of insertion loss in the range of 0.5 to 1 dB at 0 Hz, which is usually accounted by receiver equalization in high-speed designs.

Hence, as shown graph 600, the lower quality factor now dampens the via resonance making the via more usable at higher next generation speeds. This may be used both in combination with backdrilling to make a 40-50 mil via stub usable for next generation speeds (25-56 Gbps), and independent of backdrilling based for current generation speeds (12-25 Gbps).

Figure 7:
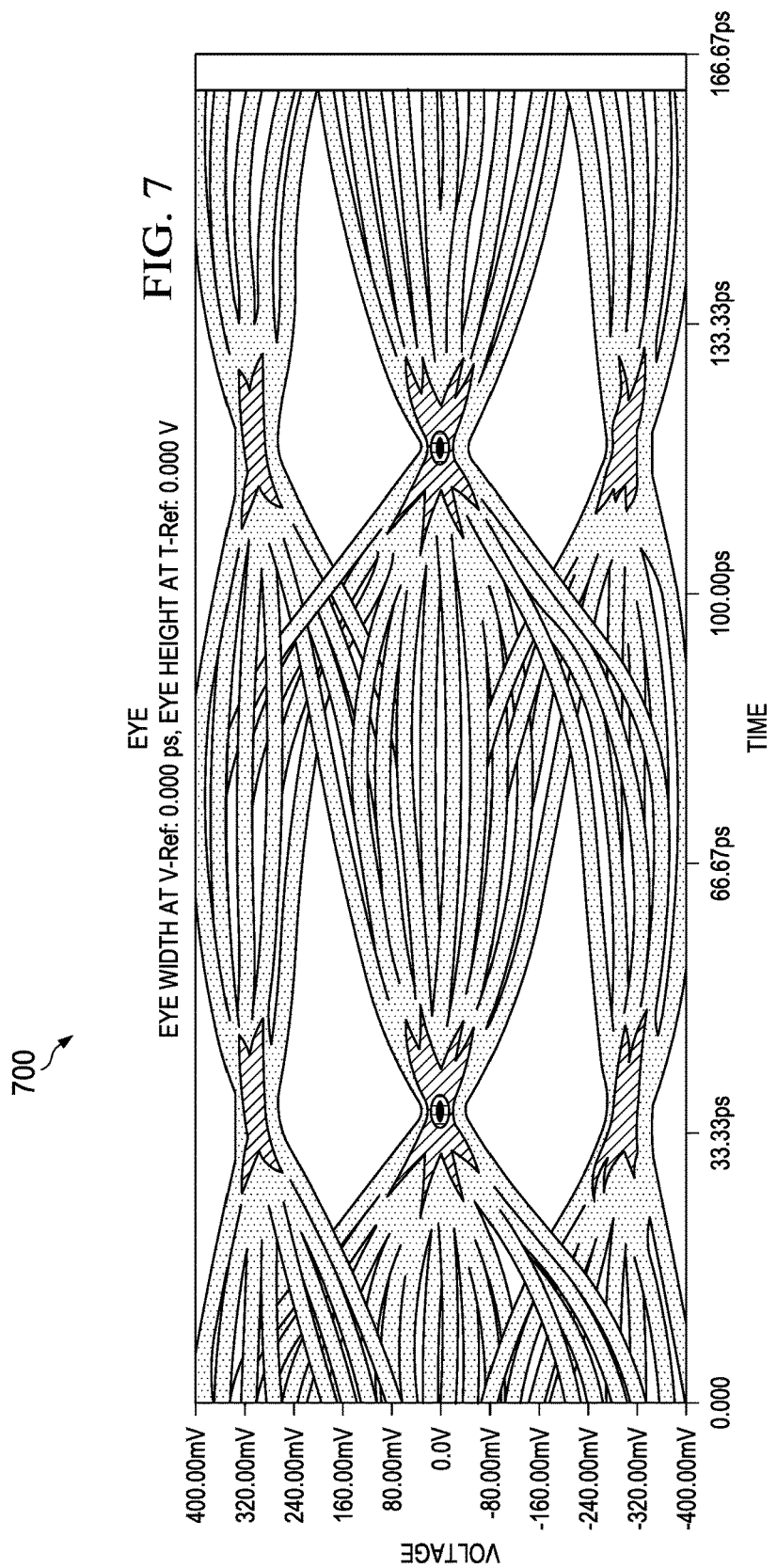
FIGS. 7 and 8 are eye diagrams illustrating transmission characteristics of a smooth via and a grooved via, respectively, according to some embodiments.
Figure 8:
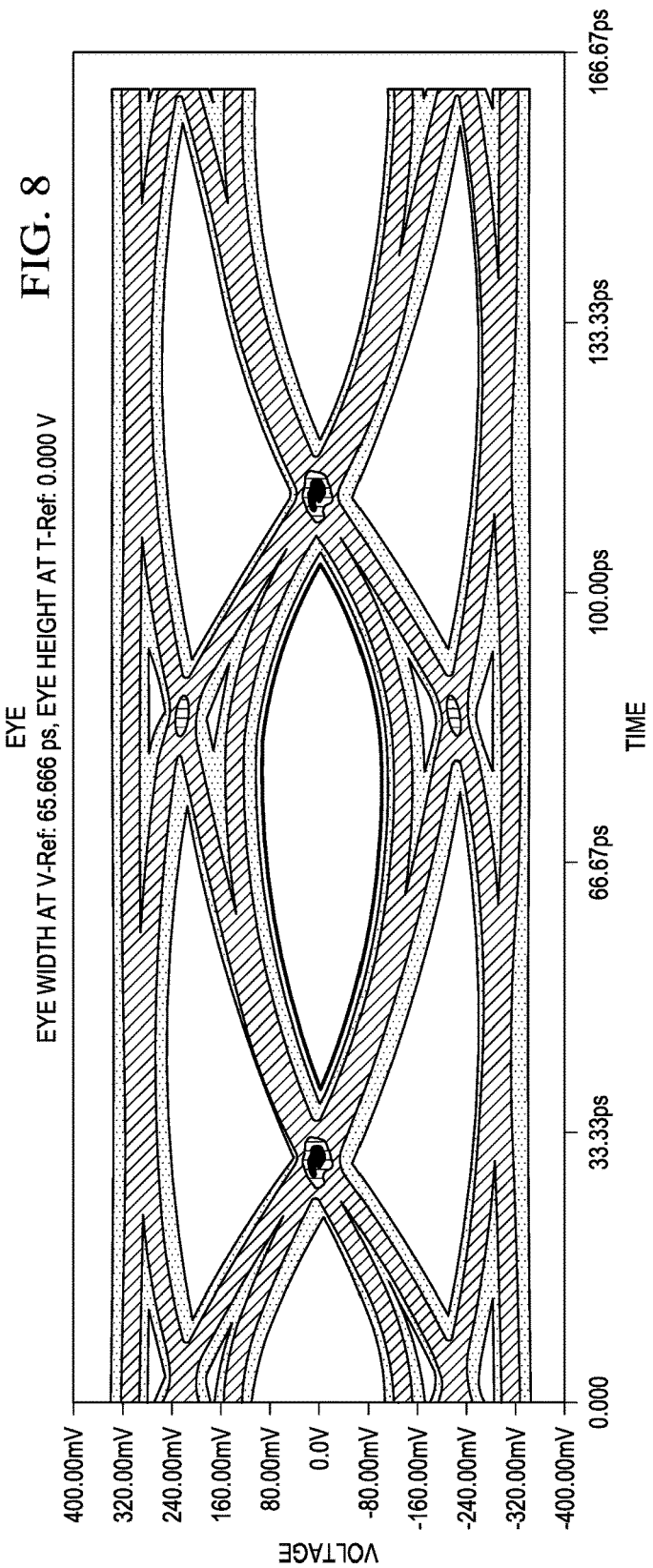

FIGS. 7 and 8 are eye diagrams for illustrating transmission characteristics of a smooth via and a grooved via in a 12 Gbps Serial Attached Small Computer System (SAS) Interface, respectively. These eye diagrams show an oscilloscope display in which a digital signal from a receiver is repetitively sampled and applied to the vertical input, while the data rate is used to trigger the horizontal sweep. As can be seen from graphs 700 and 800, the closed eye of graph 700 (for a smooth via) is opened in graph 800 (for a grooved via), which is indicative of a much superior signal-to-noise ratio and/or less distortion.

Figure 9:
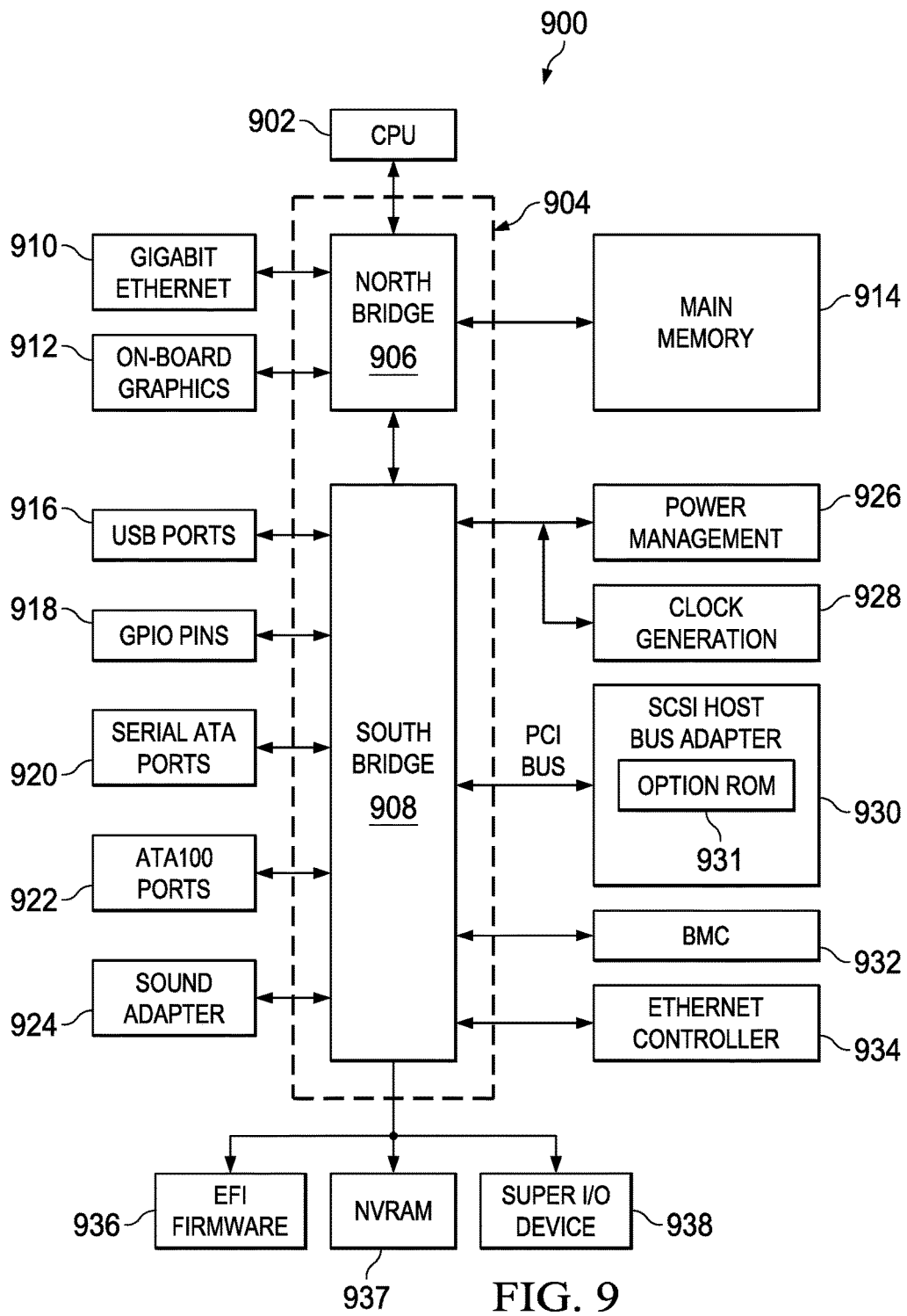
FIG. 9 is a block diagram of an example of an Information Handling System (IHS) configured to use systems and methods described herein.

FIG. 9 shows an example of IHS 900 configured to implement systems and methods described herein according to some embodiments. It should be appreciated that although certain embodiments described herein may be discussed in the context of a desktop or server computer, other embodiments may be utilized with virtually any type of IHS. Particularly, IHS 900 includes a baseboard or motherboard, which is a printed circuit board (PCB) to which components or devices are coupled by way of a bus or other electrical communication path. For example, central processing unit ("CPU") 902 operates in conjunction with a chipset 904; CPU 902 is a standard central processor that performs arithmetic and logical operations necessary for the operation of IHS 900.

Chipset 904 includes northbridge 906 and southbridge 908. Northbridge 906 provides an interface between CPU 902 and the remainder of IHS 900. Northbridge 906 also provides an interface to a random access memory (RAM) used as main memory 914 in IHS 900 and, possibly, to on-board graphics adapter 912. Northbridge 906 may also be configured to provide networking operations through Ethernet adapter 910. Ethernet adapter 910 is capable of connecting IHS 900 to another IHS (e.g., a remotely located IHS) via a network. Connections which may be made by network adapter 910 may include local area network (LAN) or wide area network (WAN) connections. Northbridge 906 is also coupled to southbridge 908.

Southbridge 908 is responsible for controlling many of the input/output (I/O) operations of IHS 900. In particular, southbridge 908 may provide one or more universal serial bus (USB) ports 916, sound adapter 924, Ethernet controller 934, and one or more general purpose input/output (GPIO) pins 918. Southbridge 908 may also provide a bus for interfacing peripheral card devices such as BIOS boot system-compliant SCSI host bus adapter 930 having option ROM 931. In some embodiments, the bus may include a peripheral component interconnect (PCI) bus. Southbridge 908 may also provide baseboard management controller (BMC) 932 for use in managing the various components of IHS 900. Power management circuitry 926 and clock generation circuitry 928 may also be utilized during the operation of southbridge 908.

Southbridge 908 is further configured to provide one or more interfaces for connecting mass storage devices to IHS 900. For instance, in an embodiment, southbridge 908 may include a serial advanced technology attachment (SATA) adapter for providing one or more serial ATA ports 920 and/or an ATA100 adapter for providing one or more ATA 100 ports 922. Serial ATA ports 920 and ATA100 ports 922 may be, in turn, connected to one or more mass storage devices storing an operating system (OS) and application programs. An OS comprises a set of programs that control operations of IHS 900 and allocation of resources. An application program is software that runs on top of the OS and uses computer resources made available through the OS to perform application specific tasks desired by the user.

Mass storage devices connected to southbridge 908 and SCSI host bus adapter 930, and their associated computer-readable media provide non-volatile storage for IHS 900. Although the description of computer-readable media contained herein refers to a mass storage device, such as a hard disk or CD-ROM drive, it should be appreciated a person of ordinary skill in the art that computer-readable media can be any available media on any memory storage device that can be accessed by the IHS 900. Examples of memory storage devices include, but are not limited to, RAM, ROM, EPROM, EEPROM, flash memory or other solid state memory technology, CD-ROM, DVD, or other optical storage, magnetic cassettes, magnetic tape, magnetic disk storage or other magnetic storage devices.

A low pin count ("LPC") interface may also be provided by southbridge 908 for connecting Super I/O device 938. Super I/O device 938 is responsible for providing a number of I/O ports, including a keyboard port, a mouse port, a serial interface, a parallel port, and other types of input/output ports. The LPC interface may also connect a computer storage media such as a ROM or a flash memory such as a non-volatile random access memory (NVRAM) for storing firmware 936 that includes program code containing the basic routines that help to start up IHS 900 and to transfer information between elements within IHS 900. EFI firmware 936 comprises a firmware that is compatible with the EFI Specification and the Framework.

The LPC interface may also be utilized to connect NVRAM 937 to IHS 900. NVRAM 937 may be utilized by firmware 936 to store configuration data for IHS 900. In other embodiments, configuration data for IHS 900 may be stored on the same NVRAM 937 as the firmware 936.

BMC 932 may include non-volatile memory having program instructions stored thereon that are usable by CPU(s) 902 to enable remote management of IHS 900. For example, BMC 932 may enable a user to discover, configure, and manage BMC 932, setup configuration options, resolve and administer hardware or software problems, etc. Additionally or alternatively, BMC 932 may include one or more firmware volumes, each volume having one or more firmware files used by the BIOS' firmware interface to initialize and test components of IHS 900.

As a non-limiting example of BMC 932, the integrated DELL Remote Access Controller (iDRAC) from DELL, INC. is embedded within DELL POWEREDGE servers and provides functionality that helps information technology (IT) administrators deploy, update, monitor, and maintain servers with no need for any additional software to be installed. The iDRAC works regardless of OS or hypervisor presence from a pre-OS or bare-metal state, because iDRAC is embedded within IHS 900 from the factory.

It should be appreciated that, in other embodiments, IHS 900 may comprise other types of computing devices, including hand-held computers, embedded computer systems, personal digital assistants, and other types of computing devices. It is also contemplated that the IHS 900 may not include all of the components shown in FIG. 9, may include other components that are not explicitly shown in FIG. 9, or may utilize an architecture different than that shown in FIG. 9.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A method for providing a via hole in a printed circuit board (PCB), the method comprising:

drilling the via hole in the PCB with a first drill bit having a first thread, wherein the first drill bit has a first pitch, wherein the PCB comprises a first layer having a first trace and a second layer having a second trace, wherein the via hole includes a first portion between the first trace and the second trace, a second portion between the second trace and a bottom surface of the PCB, and a third portion between the first trace and a top surface of the PCB, and wherein the via hole couples the first trace to the second trace through the first portion;

determining that the via hole is subject to signal attenuation due to resonance;

in response to the determination, creating rough internal surfaces in the second and third portions of the via hole to the exclusion of the first portion with a second drill having a second thread, wherein the second drill bit has a second pitch smaller than the first pitch, wherein the rough internal surfaces include a thread having a pitch of approximately 0.5 mils, and wherein the rough internal surfaces reduce the resonance; and filling the first, second, and third portions of the via hole with conductive material.

2. The method of claim 1, wherein a length of the second portion is approximately a quarter of a wavelength of the signal transmitted through the first portion, and a diameter of the via is smaller than approximately 10 mils.

3. The method of claim 1, further comprising backdrilling the via to remove a portion of the conductive material in the second portion of the via hole.

4. An Information Handling System (IHS), comprising:
a printed circuit board (PCB) having a plurality of layers; and
an integrated circuit (IC) coupled to the PCB, the PCB comprising:
a first trace formed in a first layer of the PCB;
a second trace formed in a second layer of the PCB; and
a via coupling the first trace to the second trace, the via comprising:
a first portion between the first trace and the second trace, wherein the first portion has an internal surface created with a first drill bit having a first pitch;
a second portion between the second trace and a bottom surface of the PCB, wherein the second portion has a length that causes a signal transmitted through the first portion to resonate within the second portion, wherein the second portion has a grooved internal surface created with a second drill bit having a second pitch smaller than the first pitch, wherein the second pitch is approximately 0.5 mils, and wherein the grooved internal surface reduces the resonance; and
a third portion between the first trace and a top surface of the PCB.

5. The IHS of claim 4, wherein the PCB is a motherboard having a thickness of approximately 60 to 300 mils.

6. The IHS of claim 4, wherein the IC is a central processing unit (CPU).

7. The IHS of claim 4, wherein the length of the second portion is approximately a quarter of a wavelength of the signal transmitted through the first portion.

8. The IHS of claim 4, wherein the grooved internal surface includes a threaded or jagged surface.

9. The IHS of claim 4, wherein the length of the second portion is approximately 10 mils, and wherein the signal has a speed exceeding approximately 5 Gbps.

10. A printed circuit board (PCB), comprising:
a first layer having a first trace;
a second layer having a second trace; and
a via coupling the first trace to the second trace, the via comprising:
a first portion between the first trace and the second trace, wherein the first portion has an internal surface having a first pitch;
a second portion between the second trace and a bottom surface of the PCB, wherein the second portion has a length that causes a signal transmitted through the first portion to resonate within the second portion, wherein the second portion has an internal grooved surface having a second pitch smaller than the first pitch, wherein the second pitch is approximately 0.5 mils, and wherein the internal grooved surface reduces the resonance; and
a third portion between the first trace and a top surface of the PCB.

11. The PCB of claim 10, wherein the length of the second portion is approximately a quarter of a wavelength of the signal transmitted through the first portion.

12. The PCB of claim 11, wherein the via has a diameter smaller than 10 mils.

* * * * *